(12) United States Patent
Mawby et al.

(10) Patent No.: US 8,935,130 B2
(45) Date of Patent: Jan. 13, 2015

(54) NOTCH BLENDS IN BREP MODELS

(75) Inventors: Eric Mawby, Windham, NH (US); Feng Yu, Irvine, CA (US); Haipeng Mao, Shanghai (CN); Liwei Gao, Shanghai (CN)

(73) Assignee: Siemens Product Lifecycle Management Software Inc., Plano, TX (US)

( * ) Notice: Subject to any disclaimer, the term of this patent is extended or adjusted under 35 U.S.C. 154(b) by 472 days.

(21) Appl. No.: 13/222,845

(22) Filed: Aug. 31, 2011

(65) Prior Publication Data

US 2013/0054198 A1    Feb. 28, 2013

(51) Int. Cl.
*G06F 17/50* (2006.01)

(52) U.S. Cl.
CPC ..................................... *G06F 17/50* (2013.01)
USPC .............................................................. 703/1

(58) Field of Classification Search
None
See application file for complete search history.

(56) References Cited

U.S. PATENT DOCUMENTS

| 6,489,957 | B1 * | 12/2002 | Han et al. ....................... 345/420 |
| 6,760,038 | B2 * | 7/2004 | Venkataraman et al. ..... 345/620 |
| 7,236,168 | B2 * | 6/2007 | Venkataraman et al. ..... 345/420 |
| 8,326,583 | B2 * | 12/2012 | Yu et al. ............................. 703/1 |
| 2012/0007864 | A1 | 1/2012 | Lonsdale Nanson et al. |
| 2012/0271595 | A1 * | 10/2012 | Nanson et al. .................... 703/1 |

OTHER PUBLICATIONS

PCT International Search Report mailed Jan. 17, 2012 corresponding to PCT International Application No. PCT/US2011/043050 filed Jul. 6, 2011 (21 pages).
Wolfgang Sohrt et al., Interaction with "Constraints in 3D Modeling", Jun. 5, 1991, Dept of Computer Science, University of Utah, (pp. 387-396).
Ivan E. Sutherland, "Sketchpad: A Man-Machine Graphical Communication System", XP009032646, Massachusetts Institute of Technology (pp. 329-346).
Remove Face from DocR22, 1999-2012 Spatial Corp., http://doc.spatial.com/index.php/Remove_Face, 5 pages.

* cited by examiner

*Primary Examiner* — Kamini S Shah
*Assistant Examiner* — Jay B Hann

(57) ABSTRACT

Methods for computer-aided design and visualization and corresponding systems and computer-readable mediums. A method includes receiving a BRep model and recognizing a plurality of notch or cliff blends in the BRep model. The method includes defining a chain of at least two of the plurality of notch blends. The method includes labeling the notch blends in the chain. The method includes storing the BRep model, including one or more of the recognized notch blends, the chain, and the labels of the notch blends.

14 Claims, 3 Drawing Sheets

NOTCH BLENDS IN BREP MODELS

TECHNICAL FIELD

The present disclosure is directed, in general, to computer-aided design, visualization, and manufacturing systems, product lifecycle management ("PLM") systems, and similar systems (individually and collectively, "CAD systems").

BACKGROUND OF THE DISCLOSURE

CAD systems are used to design, model, and visualize objects. Improved systems are desirable.

SUMMARY OF THE DISCLOSURE

Various disclosed embodiments include methods for computer-aided design and visualization and corresponding systems and computer-readable mediums. A method includes receiving a BRep model and recognizing a plurality of notch blends in the BRep model. The method includes defining a chain of at least two of the plurality of notch blends. The method includes labeling the notch blends in the chain. The method includes storing the BRep model, including one or more of the recognized notch blends, the chain, and the labels of the notch blends.

The foregoing has outlined rather broadly aspects and technical advantages of the present disclosure so that those skilled in the art may better understand the detailed description that follows. Additional aspects and advantages of the disclosure will be described hereinafter that form the subject of the claims. Those skilled in the art will appreciate that they may readily use the conception and the specific embodiment disclosed as a basis for modifying or designing other structures for carrying out the same purposes of the present disclosure. Those skilled in the art will also realize that such equivalent constructions do not depart from the spirit and scope of the disclosure in its broadest form.

Before undertaking the DETAILED DESCRIPTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases. While some terms may include a wide variety of embodiments, the appended claims may expressly limit these terms to specific embodiments.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which.

DETAILED DESCRIPTION

FIGS. 1 through 4, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged device. The numerous innovative teachings of the present application will be described with reference to exemplary non-limiting embodiments.

Synchronous modeling is an approach for design change in CAD systems with emphasis on modifying the current state of a model without the knowledge for how the model was constructed and without the information based on the elements or operations by which the model was constructed. Synchronous modeling is expected to recover the geometry consumed during the model construction when the geometry is needed for the design change on the model. Geometry in a native model may be kept before it is consumed for future use, but consumed geometry in a model imported from a foreign source is simply lost. Working on a model with consumed geometry is a fundamental and technically challenging problem in synchronous modeling or in any modeling system or software that lacks the history of the original model or storage of a consumed face.

Consumed geometry may occur as a result of numerous different scenarios, and certain geometries are difficult to re-create and to work with in a synchronous modeling environment. For example, "re-blend" is an important function within synchronous modeling. When a design face is changed the surrounding blend faces are recomputed (re-blended) to accommodate the change applied to the design face. A blend face is computed based on the two underlying (construction) faces that are the two sides of the edge being blended. The underlying face is referred to herein as an "under". In order to re-blend, both unders need to exist. A "notch blend" or "cliff blend", as used herein, refers to a blend where one under is consumed. Notch and cliff blends differ slightly in terms of how to heal the gap between the blend and the "plateau" face, but this difference is not important to the embodiments disclosed herein, so "notch blend" will be used herein to describe both notch and cliff blends. Disclosed embodiments address specific issues involving notch blends for synchronous modeling in CAD systems.

Figure 1:
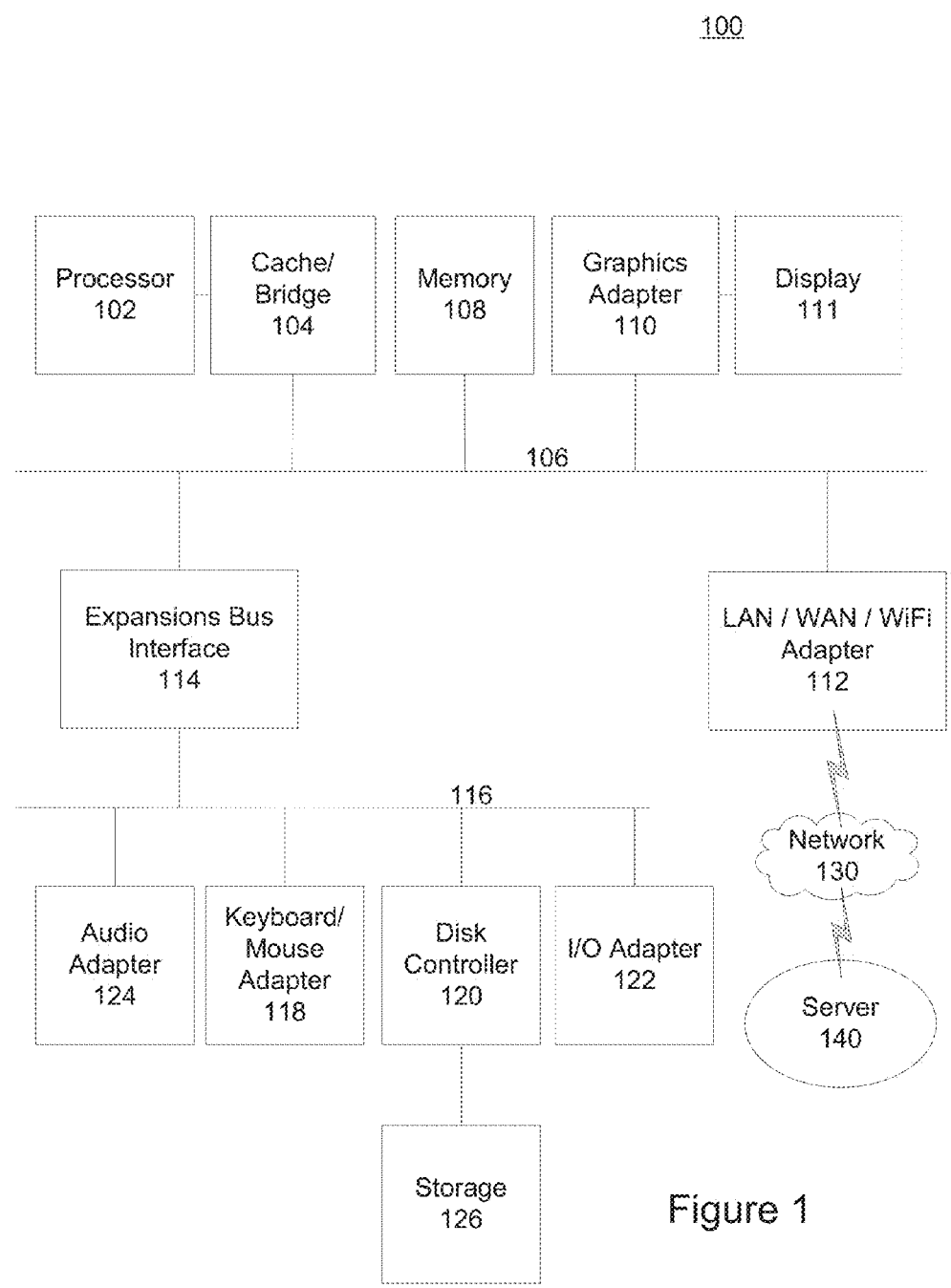
FIG. 1 depicts a block diagram of a data processing system in which an embodiment can be implemented.

FIG. 1 depicts a block diagram of a data processing system in which an embodiment can be implemented, for example as a CAD system particularly configured by software or otherwise to perform the processes as described herein, and in particular as each one of a plurality of interconnected and communicating systems as described herein. The data processing system depicted includes a processor 102 connected to a level two cache/bridge 104, which is connected in turn to a local system bus 106. Local system bus 106 may be, for example, a peripheral component interconnect (PCI) architecture bus. Also connected to local system bus in the depicted example are a main memory 108 and a graphics adapter 110. The graphics adapter 110 may be connected to display 111.

Other peripherals, such as local area network (LAN)/Wide Area Network/Wireless (e,g. WiFi) adapter 112, may also be connected to local system bus 106. Expansion bus interface 114 connects local system bus 106 to input/output (I/O) bus 116. I/O bus 116 is connected to keyboard/mouse adapter 118, disk controller 120, and I/O adapter 122. Disk controller 120 can be connected to a storage 126, which can be any suitable machine usable or machine readable storage medium, including but not limited to nonvolatile, hardcoded type mediums such as read only memories (ROMs) or erasable, electrically programmable read only memories (EE-PROMs), magnetic tape storage, and user-recordable type mediums such as floppy disks, hard disk drives and compact disk read only memories (CD-ROMs) or digital versatile disks (DVDs), and other known optical, electrical, or magnetic storage devices.

Also connected to I/O bus 116 in the example shown is audio adapter 124, to which speakers (not shown) may be connected for playing sounds. Keyboard/mouse adapter 118 provides a connection for a pointing device (not shown), such as a mouse, trackball, trackpointer, etc.

Those of ordinary skill in the art will appreciate that the hardware depicted in FIG. 1 may vary for particular implementations. For example, other peripheral devices, such as an optical disk drive and the like, also may be used in addition or in place of the hardware depicted. The depicted example is provided for the purpose of explanation only and is not meant to imply architectural limitations with respect to the present disclosure.

A data processing system in accordance with an embodiment of the present disclosure includes an operating system employing a graphical user interface. The operating system permits multiple display windows to be presented in the graphical user interface simultaneously, with each display window providing an interface to a different application or to a different instance of the same application. A cursor in the graphical user interface may be manipulated by a user through the pointing device. The position of the cursor may be changed and/or an event, such as clicking a mouse button, generated to actuate a desired response.

One of various commercial operating systems, such as a version of Microsoft Windows™, a product of Microsoft Corporation located in Redmond, Wash. may be employed if suitably modified. The operating system is modified or created in accordance with the present disclosure as described.

LAN/WAN/Wireless adapter 112 can be connected to a network 130 (not a part of data processing system 100), which can be any public or private data processing system network or combination of networks, as known to those of skill in the art, including the Internet. Data processing system 100 can communicate over network 130 with server system 140, which is also not part of data processing system 100, but can be implemented, for example, as a separate data processing system 100.

Figure 2:
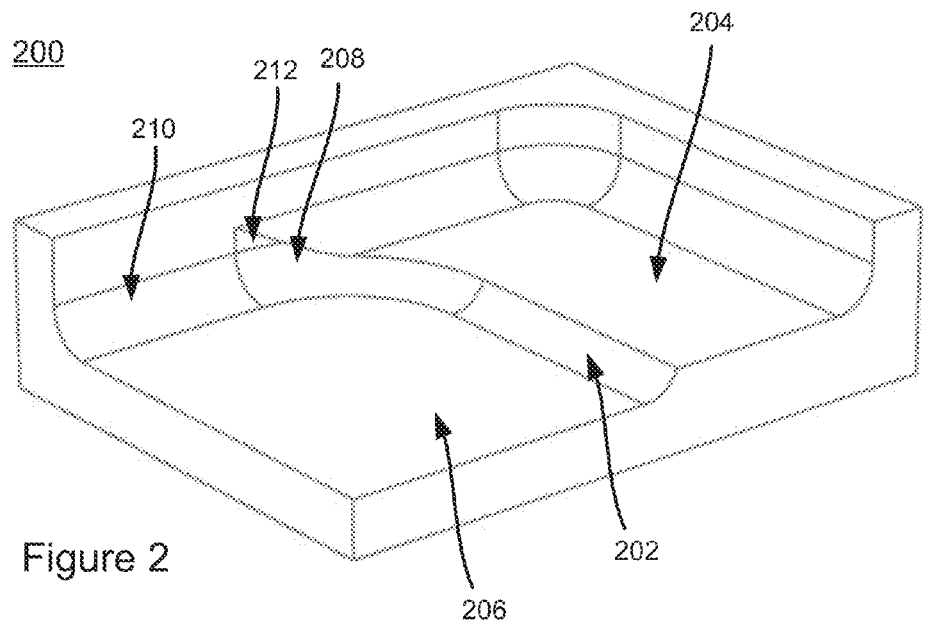
FIG. 2 depicts an example of a model with a notch blend and corresponding plateau face.

FIG. 2 depicts an example of a model 200 with a notch blend 202 and corresponding plateau face 204. As illustrated, the notch blend 202 consumed the sidewall face "under" that would have connected plateau face 204 and lower face 206.

Disclosed embodiments identify notch blend faces in a model. This can be performed by receiving a selection from a user, or can be automatically identified by the system. A candidate face selected by a user will be validated by the system as a notch blend, and for this validation, the system performs a similar process as the automatic identification. Embodiments described herein include both manual selection of a notch blend by a user and auto identification.

One condition the system uses to recognize a blend face as a notch blend is that the face must match the shape of a rolling ball. That is, the cross section of the blend face should be circular and have a constant radius. However, existing blend identification toots do not recognize notch blend because of the missing under. Another condition is that the blend is smooth to the adjacent face on one side and non-smooth to the adjacent face on the other side along the circular radius (rolling ball) direction. For example, notch blend 202 and corresponding plateau face 204. As illustrated, the notch blend 202 is smooth to adjacent face 206 but is non-smooth to plateau face 204. Disclosed embodiments can combine the two conditions to properly identify the notch blend and work on all models including imported foreign models in which the blend geometry is a surface in a boundary representation (BRep) model or is a b-surface, a surface defined by Non Uniform Rational B-spline (NURBS) curves.

Disclosed embodiments can also "chain" connected notch blends in a model. There are very few cases where a blend Ike exists in isolation of other blends. In a realistic model a blend is almost always a member of a chain of blends, and the blend chain is typically a member of a network of inter-dependent blends. For example, notch blend 202 is part of a chain of blends with blends 208 and 210. As such, re-blending a blend means the blend chain and its dependent blends participate in an extended re-blend operation.

A blend chain may contain many notch blends and many regular blends (where both unders still exists in the model) with the same radius. All the blends in a chain should be identified together. Disclosed embodiments can also identify and manipulate chains involving transition blends that connect a notch blend and regular blend.

The system can find a blend chain using a process that, given a candidate notch face, finds notch neighbors that identify as blend. If a neighboring face identifies as a blend and is the same radius and same convexity as the candidate notch then it is a notch neighbor and therefore a chain member.

In this picture, blend 210 is a regular blend. Blend 202 is a notch blend and blend 208 is a transition blend between blend 210 and blend 202. Transition blend 208 is a partial notch because one of its unders, face 212 at the top of transition blend 208, is partially consumed and partially present. This partial under itself (face 212) is also a notch blend because one of its unders is consumed by blend chain composed of 202, 208, and 210. These four faces are identified by the system as a notch blend network.

The system can also label any notch blends identified in a model. An identified notch blend needs to have its consumed under recovered and remembered in order to be reblendable later; a process referred to herein as "labeling". It requires the generation of the following information:

Blend radius—obtained along with the identification of the notch;

Topological under—obtained along with the identification of the notch;

Location, size and orientation of the consumed under; and

Coincident face relation for under faces that share the same geometry.

Figure 3:
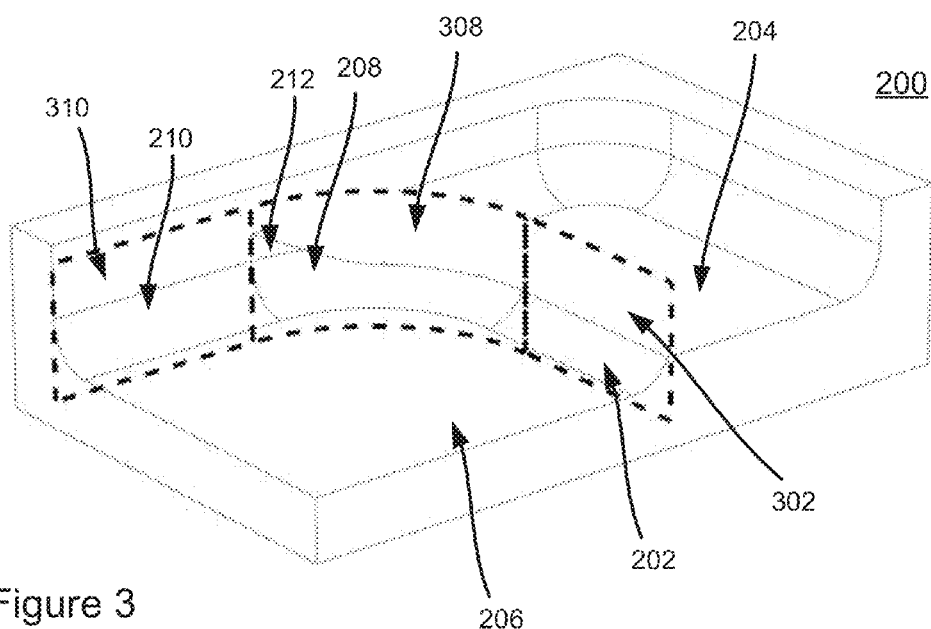
FIG. 3 illustrates reconstructed faces in the example of FIG. 2 with the reconstructed faces shown in dashed lines.

The system can reconstruct the consumed unders using this information. FIG. 3 illustrates reconstructed faces in the example of model 200 with notch blend 202 and corresponding plateau face 204, with the reconstructed faces shown in dashed lines, in this example, a planar face 302 extending from blend 202 upwards (normal to the Ike 204) is the to-bereconstructed under of the notch blend 202. A cylindrical face 308 is the to-be-reconstructed under of the transition blend (partial notch) 208. The planar face extension 310 of the left sidewall is the under of the regular blend; this under is not consumed, but is included for the completeness of the chain. The consumed under of the triangle notch 212 was the same face as the consumed under of notch blend 202 before it was consumed. So the reconstruction of the two unders will have the same geometry. This coincident thee relation can be identified so that the two unders will behave as the same face.

The system can find a topological under using a process that finds the under from among the neighboring aces of a candidate notch face. The topological under is a face that neighbors the candidate and is tangent along the common edge. In the case of a sphere the candidate and under are tangent at a point. The notch edge opposite the topological under is not tangent by definition of notch. There may be more than one face tangent along a common edge of the candidate.

The system can identify the blend radius of a candidate face. If the surface type of the candidate thee is analytic then the system gets the radius directly from the face. If the surface type is b-surface then the system measures the radius of the face with a sampling algorithm as known to those of skill in the art.

The system can also change the consumed notch blend under in a model. Once a notch blend chain is labeled, re-blending occurs when adjacent faces are changed behind the scene, as also described in commonly-assigned U.S. patent application Ser. No. 13/091,201, filed Apr. 21, 2011, and hereby incorporated by reference. Disclosed embodiments can change the model by changing the consumed under.

The consumed under is not part of the model user sees thus it is a 'virtual' face to the model. Disclosed embodiments can selectably treat the virtual face as "alive" to user, letting user visualize and interact with it the same way as with a real face and driving the change of the model with the change of the virtual face.

Disclosed embodiments can use one or more techniques disclosed herein to recognize notch blends, chain notch blends, label notch blends in a chain, and change virtual faces, particularly in BRep models.

The "recognize notch blend" processes are used to identify if a face is a notch blend. The candidate face can be a cylinder, a torus, a swept, a spun or generally a b-surface. To be a notch blend, it needs to satisfy the condition that along one (u or v) parameterization of the surface, each iso-parameter curve is geometrically an arc and all such arcs have a common radius, and one end of the arc is tangent to a face (topological under) and the other end of the arc is non-tangentially connected to a face (plateau). If some iso-arcs are tangent to faces at both ends, it is a partial notch (transition between a notch and regular blend).

To proceed, the system samples iso-parametric curves in each parameterization direction of candidate blends to verify if each of the curves fits to an arc and the radii of all the arcs are the same. If both directions have constant radius arcs, the system takes the arc with small radius as the rolling ball section. Assume, for example, this is in iso-u direction. The system then checks various arcs along this direction to see if all arcs have one end tangent to a face and the other end sharply connected to a face, or if a part of the arcs are placed this way. The face that is always tangent to the arc ends is identified as the alive under. The system can also verify if the plane of the arc contains the surface normal of the alive under at the arc end to invalidate any candidate face that has twisted parameterization.

The system can also perform corner or vertex notch blend recognition. Such as blend connects to three faces; it is connected to two notch blends smoothly and connected to a plateau face non-smoothly. Instead of checking the tangency to alive under along the rolling ball section side, the system can check the tangency along the non-rolling ball section side to the two adjacent notches.

The "chain notch blends" processes are used to combine connected notch blends, transition (partial notch) blends and regular blends into a blend chain. To proceed, the system determines if one candidate face is recognized as notch blend, and if so, checks the adjacent faces along the rolling ball (constant v) direction.

If an adjacent face is a notch blend with the same radius, the system can include it in the chain and continue the same process from this notch.

If an adjacent face is a partial notch blend, the system can include it in the chain. The system finds the partial notch blend's partially-consumed under and includes it in the chain. The system determines if the other adjacent face of this partial notch is a smoothly-connected regular blend with the same radius, and if so, includes it in the chain and continues the process from that face. Otherwise, the process stops.

The system determines if an adjacent face is a regular blend, and if so, includes it in the chain. The system determines if the other adjacent thee is a notch blend or partial notch blend or smoothly connected regular blend with the same radius, and if so, includes it in the chain and continues the same process from that face. Otherwise, the chaining process stops.

If an adjacent face is other than the above cases, the chaining process stops.

The chaining process continues recursively until both sides of the face are checked. Note that adjacent notch blends in a chain may not be smoothly connected.

If a face in the notch chain has dependent blend, the system repeats the process from the dependent blend until all dependent blends are included. A chain from a dependent blend does not need to have the same radius as the original chain.

The "label notch blends in a chain" processes are used to label notch blends in chains. Although the labeling should happen for dependent chains together, the process can apply to each chain independently.

The system can start with an individual notch blend. The system can have already obtained the radius and alive under information via the notch blend recognition processes described above.

To obtain a consumed under of native blend, the system saves a copy of the under before it is consumed by the blend operation. The saved under may be arbitrarily trimmed and may be shared by different notch blends. The system sorts out the positions and the orientations of the boundary edges of the under face relative to the blend face so that the under face can be trimmed, or extends it to a four-sided shape that fits best for reblend.

To obtain consumed under of imported blend, the system uses the blend radius and topological under to determine the would-be (tangentially) intersection position between the blend and the consumed under along each rolling ball section (u parameter). The system can create a curve per the intersection positions. The system can then extrude a face from the curve along an angle (perpendicular by default) to the alive under; this face is the consumed under.

The system can build virtual under using a process that reconstructs a type appropriate face to serve as an under for the notch blend and eventually allows the notch blend to reblend. Given that a notch is truncated by a plateau face it has only one topological under. The other under a virtual under—was consumed by whatever caused the notch. The consumed under can be reconstructed in order to label and eventually reblend a notch blend the consumed under must be reconstructed.

For each notch blend chain, the system combines together the recovered consumed unders from individual blends to behave as if they are connected faces. For faces that have coincident geometry, the system specifies the coincident relation so that they will always act together. For example, the consumed under of the transition blend partial under is pointed to the same under of its corresponding notch blend. For another example, the reconstructed under of the transition blend is geometrically a copy of the partial under of the transition blend, so the system can set a coincident relation on them.

The system can store all this information with the blend chain as notch labels.

The system can use a change virtual face process to change the model by changing the "virtual" consumed under of notch blend. To proceed, the geometry of the consumed under is extracted from the kept label on notch blend. A sheet body is created from this virtual geometry. This sheet body is displayed and made selectable for user to interact with it as a real body. Synchronous modeling operations (including move, offset, replace, make coplanar, etc.) can apply to it. The correspondence between the face of virtual sheet body and the notch blend is maintained through the process so that the change of virtual face is mapped to the change of the real model as if the virtual face is connected to the model in the position before it is consumed. The notch blend will re-blend at the new position of the virtual under. The virtual sheet body is deleted after the change.

Figure 4:
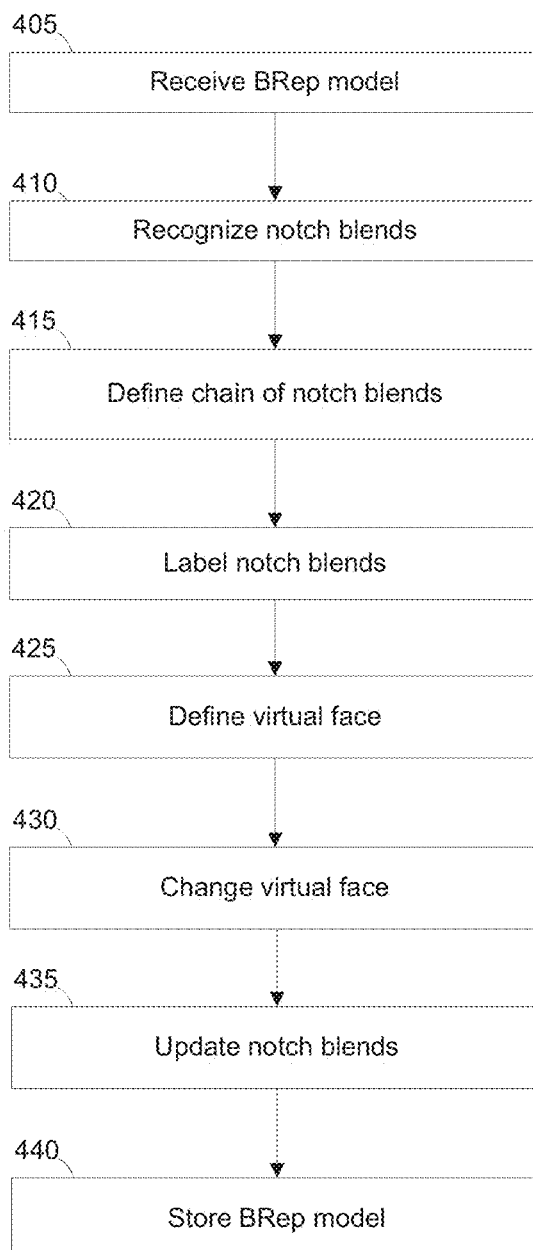
FIG. 4 depicts a flowchart of a process in accordance with disclosed embodiments.

FIG. 4 depicts a flowchart of a process in accordance with disclosed embodiments that may be performed, for example, by a CAD system. The steps below can be performed, for example, as part of a graphic modeling and visualization process, or as part of importing a model into a CAD system that uses synchronous modeling techniques.

The system receives a boundary representation (BRep) model (step 405). Receiving, as used herein, can include loading from a storage, receiving from another process or system, or receiving via, an interaction with a user.

The system recognizes a plurality of notch blends in the BRep model (step 410). This can be performed using a recognize notch blend process as described above, including one or more subprocesses.

The system defines a chain of at least two of the plurality of notch blends (step 415). This can be performed using a chain notch blends process as described above, including one or more subprocesses.

The system labels the notch blends in the chain (step 420). This can be performed using a label notch blends process as described above, including one or more subprocesses.

The system can define a virtual face corresponding to one or more of the notch blends (step 425). The virtual face can correspond at least in part to a consumed under from which one of the notch blends was created.

The system can change the virtual face (step 430), according to a user input or otherwise, and update the corresponding one or more notch blends according to the change to the virtual face (step 435). This can be performed, for example, using a change virtual face as described above.

The system can store the BRep model (step 440), including one or more of the recognized notch blends, the chains, the labels of the notch blends, and/or the virtual face, and can include any updates or changes to the virtual face and corresponding notch blends.

The ability of recreating and editing a model with consumed geometry as disclosed herein provide distinct technical advantages over conventional systems. Disclosed embodiments allow users to make design change on their model more powerfully than the system on which their model was originally built even without the knowledge of consumed data.

Of course, those of skill in the art will recognize that, unless specifically indicated or required by the sequence of operations, certain steps in the processes described above may be omitted, performed concurrently or sequentially, or performed in a different order. Nothing in the processes or systems described herein is intended to be viewed as essential or necessary to the performance of other functions unless described as such herein.

Those skilled in the art will recognize that, for simplicity and clarity, the full structure and operation of all data processing systems suitable for use with the present disclosure is not being depicted or described herein. Instead, only so much of a data processing system as is unique to the present disclosure or necessary for an understanding of the present disclosure is depicted and described. The remainder of the construction and operation of data processing system 100 may conform to any of the various current implementations and practices known in the art.

It is important to note that while the disclosure includes a description in the context of a fully functional system, those skilled in the art will appreciate that at least portions of the mechanism of the present disclosure are capable of being distributed in the form of instructions contained within a machine-usable, computer-usable, or computer-readable medium in any of a variety of forms, and that the present disclosure applies equally regardless of the particular type of instruction or signal bearing medium or storage medium utilized to actually carry out the distribution. Examples of machine usable/readable or computer usable/readable mediums include: nonvolatile, hard-coded type mediums such as read only memories (ROMs) or erasable, electrically programmable read only memories (EEPROMs), and user-recordable type mediums such as floppy disks, hard disk drives and compact disk read only memories (CD-ROMs) or digital versatile disks (DVDs).

Although an exemplary embodiment of the present disclosure has been described in detail, those skilled in the art will understand that various changes, substitutions, variations, and improvements disclosed herein may be made without departing from the spirit and scope of the disclosure in its broadest form.

None of the description in the present application should be read as implying that any particular element, step, or function is an essential element which must be included in the claim scope: the scope of patented subject matter is defined only by the allowed claims. Moreover, none of these claims are intended to invoke paragraph six of 35 USC §112 unless the exact words "means for" are followed by a participle.

What is claimed is:

1. A method performed by a CAD data processing system and comprising:
receiving a boundary representation (BRep) model;
recognizing a plurality of notch blends in the BRep model;
defining a chain of at least two of the plurality of notch blends;
labeling the notch blends in the chain, including generating a blend radius corresponding to each notch blend, a topological under corresponding to each notch blend, and a location, a size, and an orientation of a consumed under corresponding to each notch blend; and storing the BRep model, including one or more of the recognized notch blends, the chain, and the labels of the notch blends.

wherein the data processing system also defines a virtual face corresponding to one or more of the notch blends, and wherein the data processing system also changes the virtual face and updates the corresponding one or more notch blends according to the change to the virtual face.

2. The method of claim 1, wherein the virtual face corresponds at least in part to a consumed under from which one of the notch blends was created.

3. The method of claim 1, wherein storing the BRep model includes storing the virtual face, changes to the virtual face, and corresponding updates to the notch blends.

4. The method of claim 1, wherein recognizing the plurality of notch blends includes sampling iso-parametric curves in each parameterization direction for each candidate blend to verify if each of the curves fits to an arc and the radii of all the arcs are the same.

5. The method of claim 1, wherein defining the chain includes determining if an adjacent face to a first notch blend is a notch blend with the same radius.

6. A data processing system comprising:
a processor; and
an accessible memory, the data processing system particularly configured to
receive a boundary representation (BRep) model;
recognize a plurality of notch blends in the BRep model;
define a chain of at least two of the plurality of notch blends;
label the notch blends in the chain, including generating a blend radius corresponding to each notch blend, a topological under corresponding to each notch blend, and a location, a size, and an orientation of a consumed under corresponding to each notch blend; and
store the BRep model, including one or more of the recognized notch blends, the chain, and the labels of the notch blends,
wherein the data processing system also defines a virtual face corresponding to one or more of the notch blends, and
wherein the system also changes the virtual face and updates the corresponding one or more notch blends according to the change to the virtual face.

7. The data processing system of claim 6, wherein the virtual face corresponds at least in part to a consumed under from which one of the notch blends was created.

8. The data processing system of claim 6, wherein storing the BRep model includes storing the virtual face, changes to the virtual face, and corresponding updates to the notch blends.

9. The data processing system of claim 6, wherein recognizing the plurality of notch blends include sampling iso-parametric curves in each parameterization direction for each candidate blend to verify if each of the curves fits to an arc and the radii of all the arcs are the same.

10. The data processing system of claim 6, wherein defining the chain includes determining if an adjacent face to a first notch blend is a notch blend with the same radius.

11. A non-transitory computer-readable medium encoded with executable instructions that, when executed, cause one or more data processing systems to:
receive a boundary representation (BRep) model;
recognize a plurality of notch blends in the BRep model;
define a chain of at least two of the plurality of notch blends;
label the notch blends in the chain, including generating a blend radius corresponding to each notch blend, a topological under corresponding to each notch blend, and a location, a size, and an orientation of a consumed under corresponding to each notch blend; and
store the BRep model, including one or more of the recognized notch blends, the chain, and the labels of the notch blends,
wherein the one or more data processing systems also define a virtual face corresponding to one or more of the notch blends, and
wherein the one or more data processing systems also change the virtual face and updates the corresponding one or more notch blends according to the change to the virtual face.

12. The non-transitory computer-readable medium of claim 11, wherein the virtual face corresponds at least in part to a consumed under from which one of the notch blends was created.

13. The non-transitory computer-readable medium of claim 11, wherein recognizing the plurality of notch blends include sampling iso-parametric curves in each parameterization direction for each candidate blend to verify if each of the curves fits to an arc and the radii of all the arcs are the same.

14. The non-transitory computer-readable medium of claim 11, wherein defining the chain includes determining if an adjacent face to a first notch blend is a notch blend with the same radius.

* * * * *